US006787709B2

(12) United States Patent
Vinther

(10) Patent No.: US 6,787,709 B2
(45) Date of Patent: Sep. 7, 2004

(54) COMPLIANT ELECTRICAL CONTACT

(75) Inventor: Gordon A. Vinther, Altadena, CA (US)

(73) Assignee: Ardent Concepts, Inc., Hampton, NH (US)

( * ) Notice: Subject to any disclaimer, the term of this patent is extended or adjusted under 35 U.S.C. 154(b) by 0 days.

(21) Appl. No.: 10/341,723

(22) Filed: Jan. 14, 2003

(65) Prior Publication Data

US 2003/0132020 A1 Jul. 17, 2003

Related U.S. Application Data

(60) Provisional application No. 60/349,850, filed on Jan. 17, 2002, and provisional application No. 60/349,852, filed on Jan. 17, 2002.

(51) Int. Cl.[7] .............................. H05K 1/16; H05K 1/11

(52) U.S. Cl. ........................ 174/260; 174/261; 174/267; 439/66

(58) Field of Search .......................... 174/36, 260, 261, 174/267; 361/769, 787; 324/149, 537, 538, 754, 765; 439/66, 67, 91

(56) References Cited

U.S. PATENT DOCUMENTS

| | | | | | |
|---|---|---|---|---|---|
| 4,029,375 | A | * | 6/1977 | Gabrielian | 439/66 |
| 4,998,886 | A | * | 3/1991 | Werner | 439/66 |
| 5,017,738 | A | * | 5/1991 | Tsuji et al. | 174/94 R |
| 5,101,553 | A | * | 4/1992 | Carey et al. | 29/882 |
| 5,167,512 | A | * | 12/1992 | Walkup | 439/66 |
| 5,230,632 | A | * | 7/1993 | Baumberger et al. | 439/66 |
| 5,388,998 | A | * | 2/1995 | Grange et al. | 439/66 |
| 5,495,667 | A | * | 3/1996 | Farnworth et al. | 29/843 |
| 5,667,410 | A | * | 9/1997 | Johnston | 439/700 |
| 6,033,233 | A | * | 3/2000 | Haseyama et al. | 439/66 |
| 6,150,616 | A | * | 11/2000 | Kazama | 174/267 |
| 6,400,172 | B1 | * | 6/2002 | Akram et al. | 324/765 |

FOREIGN PATENT DOCUMENTS

| | | | | |
|---|---|---|---|---|
| EP | 0462706 A1 | * | 12/1991 | H01R/11/18 |
| GB | 2 273 830 A | * | 12/1993 | H01R/11/03 |
| WO | WO 92/08258 | * | 5/1992 | H01R/9/09 |

* cited by examiner

*Primary Examiner*—William H. Mayo, III
(74) *Attorney, Agent, or Firm*—Altman & Martin

(57) ABSTRACT

A compliant electrical contact having a closed coil with opposed, paraxial leads extending therefrom at an angle from the axis of the coil. The electrically shorted loops of the coil slide on the surfaces of one another as axial force is applied to the ends of the leads, providing compliance. The contact can be made extremely small such that pitches in the micrometer range can be achieved with very low inductance values. The contact is a component of an assembly where it is installed in a through aperture in a dielectric sheet. The coil fits into a larger center section of the aperture. The leads extend from opposed openings of the aperture. Optionally, the aperture is filled with a compliant, conductive elastomer.

15 Claims, 4 Drawing Sheets

COMPLIANT ELECTRICAL CONTACT

CROSS-REFERENCES TO RELATED APPLICATIONS

The applicant wishes to claim the benefit of U.S. Provisional Patent Application No. 60/349,850, dated Jan. 17, 2002, for SKEWED COIL ELECTRICAL CONTACT, in the name of Gordon A. Vinther, and U.S. Provisional Patent Application No. 60/349,852, dated Jan. 17, 2002, for TANGLED WIRE ELECTRICAL CONTACT, in the name of Gordon A. Vinther.

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to electrical contacts, more particularly, to very small compliant electrical contacts with very low inductance at high frequencies.

2. Description of the Related Art

The purpose of an electrical contact is to provide a separable electrical interconnection between two electrical conductors. The characteristic of separability means that the conductors are not interconnected by permanent mechanical means, such as soldering or bonding, but by temporary mechanical means. Consequently, in order to maintain a good mechanical contact in an attempt to minimize detrimental electrical effects of the contact, some form of spring force is used to press the two conductors together. These electrical contacts are called compliant (as in “flexible”) contacts.

Small compliant contacts are necessary for separably interconnecting integrated circuit (IC) devices to whatever electrical device the user desires. A prime example is connecting the IC to a test fixture or sorting equipment used for testing and sorting IC’s during manufacture. The compliant contact should be as close to electrically transparent as possible in order to minimize parasitic effects, such as inductance, that alter the signals to and from the IC which could lead to erroneous results.

Compliant contacts provide another advantage in that they can compensate for noncoplanarities of the electronic unit under test (UUT) being connected. The conduction points on the UUT are not exactly coplanar, that is, they are not within the same plane, even between the same conduction point on different UUT’s. The compliant contacts deflect by different amounts depending upon the actual position of the conduction point.

Conventional compliant contacts for connecting to UUT’s include spring probes, conductive rubber, compliant beam contacts, and bunched up wire called fuzz buttons. Each technology provides the necessary means to overcome the noncoplanarities between the contact points and provides uniform electrical contact throughout a plurality of contacts. Each technology has shortcomings in one characteristic or another and all have high electrical parasitic characteristics. In addition, they are relatively expensive to manufacture.

A typical spring probe consists of at least three or four parts, a hollow barrel with a spring and one or two plungers. The spring is housed in the barrel with the end of the plungers crimped in opposed open ends of the barrel at the ends of the spring. The spring biases the plungers outwardly, thereby providing a spring force to the tip of the plungers. Spring probes can have highly varying degrees of compliance and contact force, and are generally very reliable for making contact many times or for many cycles. Spring probes can accommodate many different conduction interfaces, such as pads, columns, balls, etc. Spring probes, however, have a size problem in that the spring itself cannot be made very small, otherwise consistent spring force from contact to contact cannot be maintained. Thus, spring probes are relatively large, leading to an unacceptably large inductance when used for electrical signals at higher frequencies. Additionally, spring probes are relatively costly since the three components must be manufactured separately and then assembled.

Conductive rubber contacts are made of rubber and silicones of varying types with embedded conductive metal elements. These contact solutions usually are less inductive than spring probes, but have less compliance and are capable of fewer duty cycles than spring probes. The conductive rubber works when the conduction point is elevated off the UUT thus requiring a protruding feature from the UUT or the addition of a third conductive element to the system to act as a protruding member. This third member lessens the contact area for a given contact force and thus increases the force per unit area so that consistent contact can be made. The third element may be a screw machined button which rests on the rubber between the conduction point. This third element can only add inductance to the contact system.

Compliant beam contacts are made of a conductive material formed such that deflection and contact force is attained at one end to the UUT conduction point while the other end remains fixed to the other conductor. In other words, the force is provided by one or more electrically conductive leaf springs. These contacts vary greatly in shape and application. Some compliant beam contacts are small enough to be used effectively with IC’s. Some compliant beam contacts use another compliant material, such as rubber, to add to the compliance or contact force to the beam contact point. These later types tend to be smaller than traditional compliant beam contacts and thus have less inductance and are better suited for sorting higher frequency devices. However, these contacts still tend to be somewhat too large to be useful in some radio frequency (RF) applications.

Fuzz buttons are a relatively old yet simple technology in which a wire is crumpled into a cylindrical shape. The resulting shape looks very much like tiny cylinder made of steel wool. When the cylinder is placed within a hole in a sheet of nonconductive material, it acts like a spring that is continuously electrically shorted. It provides a less inductive electrical path than other contact technologies. Like rubber contacts, the fuzz button is most commonly used with a third element needed to reach inside the hole of the nonconductive sheet to make contact with the fuzz button. This third element increases parasitic inductance, degrading the signals to and from the UUT.

IC packaging technology is evolving toward being smaller, higher frequency (faster), and cheaper, resulting in new requirements for these types of electrical contacts. They need to perform adequately at the lowest cost.

BRIEF SUMMARY OF THE INVENTION

An object of the present invention is to provide a compliant contact with a lower self-inductance at higher frequencies than existing technologies.

Another object is to provide a low-self-inductance contact that provides sufficient compliance to test various UUT's.

Yet another object is to provide a low-self-inductance contact that can be made extremely small for testing UUT's with close conductions points A further object is to provide a low-self-inductance contact that is relatively inexpensive to manufacture.

The present invention is a very low self-inductance, compliant contact in two embodiments. The skewed coil embodiment includes a coil of wire with a pair of oppositely extending leads. The leads extend in a direction angled from the coil axis, the magnitude of the angle being dependent on the particular application. The greater the angle, the greater the force necessary to compress the contact. During compression, the coil loops are electrically shorted while they slide along each other. The coil only needs to have enough of a loop to cause a short circuit between the leads when compressed, a minimum of just over 360°.

The cross-sectional shape of the wire can be any shape, including round, square, triangular, elliptical, rectangular, or star, nor does the cross-sectional dimension have to be uniform over the length of the wire. Cross-section with flat sides provide a greater contact surface than wire with a round or oval cross-section, but are not necessarily preferred. The wire is made of any electrically conductive material which has inherent elastic properties.

The leads ends can be configured in shapes that aid in the contact integrity, for example a hemisphere or ring for receiving a ball contact, or a spear for piercing oxides.

In one application, the contact is placed within a through aperture in a dielectric panel. The aperture has openings at both ends of a larger center section. In one embodiment, the dielectric panel has a base sheet with one of the openings and the center section and a top sheet with the other opening. The contact is placed in the center section and the sheets are sandwiched together, capturing the contact within the aperture. In another embodiment, the dielectric panel has two mirror image sheets where each sheet has one opening and a half of the center section. The contact is placed in one side and the sheets are sandwiched together to capture the contact. Optionally, the remaining space of the aperture is filled with a compliant, electrically conductive elastomer that adds resiliency and aids in electrically shorting the coil loops.

The raveled wire embodiment of the contact of the present invention is created by forcing a length of wire into a cylindrical cavity that has a diameter larger than the cross-sectional dimension of the wire, resulting in randomly entangled convolutions formed within the confines of a cylindrical shape. The lead ends protruding paraxially from the convolutions. The characteristics of the wire are the same as those of the skewed coil contact. All other characteristics of the raveled wire contact are the same as or similar to those of the skewed coil contact.

Other objects of the present invention will become apparent in light of the following drawings and detailed description of the invention.

BRIEF DESCRIPTION OF THE DRAWINGS

For a fuller understanding of the nature and object of the present invention, reference is made to the accompanying drawings, wherein.

DETAILED DESCRIPTION OF THE INVENTION

The present invention is a compliant electrical contact with a very low self-inductance. It has two embodiments.

1. The Skewed Coil Embodiment of FIGS. 1 to 10

In the skewed coil embodiment, shown in FIGS. 1–10, the contact 10 is created by winding a length of electrically conductive wire into a cylindrical coil 12. The gap 44 between loops 14 of the coil 12, shown in FIG. 6, ranges from essentially no gap (a closed coil) to a distance of up to about 100% of the largest wire cross-sectional dimension. The greater the wire cross-sectional dimension, the greater the gap 44 can be as a percentage of the cross-sectional dimension. For example, with a wire cross-sectional dimension of 0.0031 inch, a gap of 0.0001 inch (3%) is acceptable, whereas with a wire cross-sectional dimension of 0.020 inch, a gap of 0.010 inch (50%) is acceptable.

Figure 1:
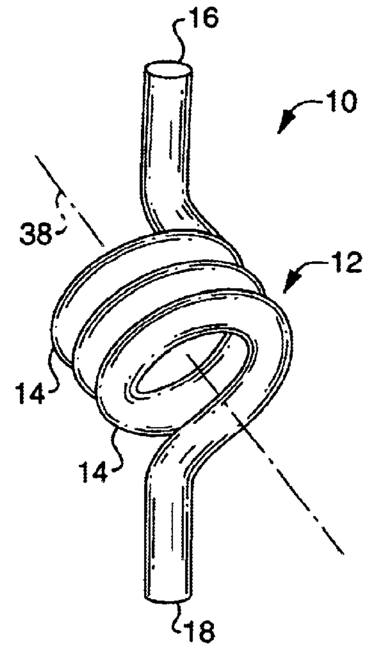
FIG. 1 is a perspective view of the basic contact of the skewed coil embodiment of the present invention.
Figure 2:
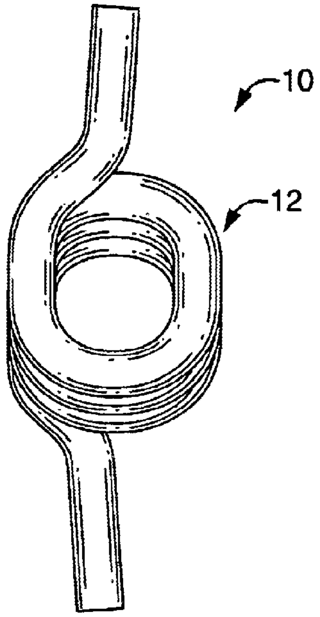
FIG. 2 is a side view of the skewed coil contact with oval loops.

The coil 12 can be round, as in FIG. 1, or oval, as in FIG. 2. The two wire extremities extend as leads 16, 18 away from the coil 12 in opposite directions generally parallel to each other and at an angle from the coil axis 38. The magnitude of this skew angle will depend on the particular application and the compliance forces required for that application. The greater the angle, the greater the force necessary to compress the contact 10, which means that the contact 10 will provide a greater force against the conduction point of the UUT. When the contact 10 is mounted such that the leads 16, 18 can be compressed axially, the coil 12 provides compliance as the loops 14 slide along each other. When the compression force is removed, the loops 14 return to their quiescent state. While compressed, the coil 12 pushes the leads 16, 18 against the conduction points of the UUT being connected, providing an acceptable electrical connection. In addition, the coil 14 provides the necessary feature of adjusting for the noncoplanarities of the conduction points.

Figure 3:
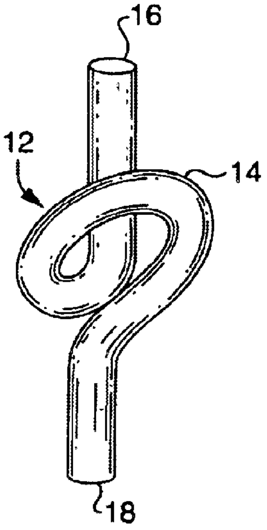
FIG. 3 is a perspective view of the skewed coil contact with a minimum coil.
Figure 4:
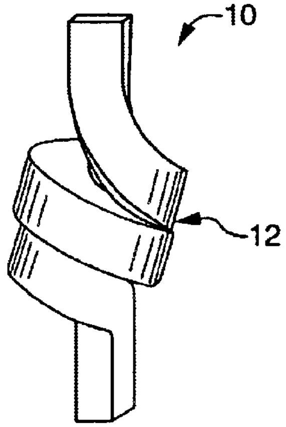
FIG. 4 is a side view of the skewed coil contact made from a wire with rectangular cross-section.
Figure 5:
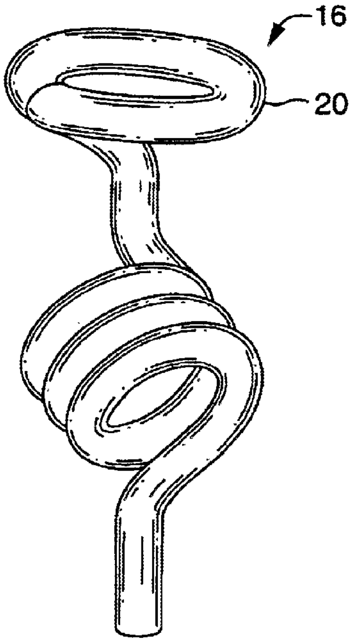
FIG. 5 is a perspective view of the skewed coil contact with a lead formed into a ring.
Figure 6:
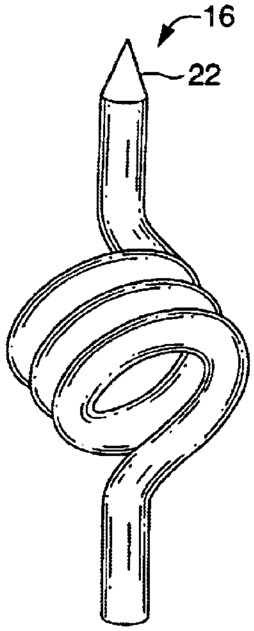
FIG. 6 is a perspective view of the skewed coil contact with a lead formed into a prong.

Once the gap 44 is closed, the loops 14 are electrically shorted throughout the compression of the contact 10 while they slide along each other. The coil 12 only needs to have enough of a loop to cause a short circuit between the leads 16, 18 when compressed, and thus can be extremely short with very low electrical parasitics. The smallest coil has slightly more than one loop, as shown in FIG. 3. The wire is coiled a minimum of just over 360° so that the ends of the coil 12 make contact during compression.

In addition to the skew angle, the force versus deflection curve of the skewed coil contact 10 is also determined by the volume of the wire used in manufacturing the contact, e.g. the wire cross-sectional dimension, coil diameter, and wire length, as well as the cross-sectional shape and wire material. The cross-sectional shape of the wire can be round, as shown in FIG. 1, or any other shape including square, triangular, elliptical, rectangular, or star. The present invention also contemplates that the cross-sectional dimension does not have to be uniform over the length of the wire. When using wire with a cross-section having flat sides, such as rectangular or star-shaped, adjacent loops are in contact along a greater surface area than when using wire with a round or oval cross-section. Consequently, the shortest electrical path possible is created, resulting in a lower inductance connection. However, for cost and other reasons, wire with flat sides is not necessarily preferred over round and oval wire.

The wire can be made of any electrically conductive material which has inherent elastic properties, for example, stainless steel, beryllium copper, copper, brass, and nickel chromium alloy. All of these materials can be used in varying degrees of temper from annealed to fully hardened.

The ends of the leads 16, 18 can be configured in shapes that aid in the contact integrity of the contact point. One example of a lead formation is a hemisphere or ring 20, shown in FIG. 5, for receiving a ball contact as in the testing of a ball grid array (BGA) device. Another example is a spear, shown in FIG. 6, with one or more prongs 22 for piercing oxides at the conduction point.

Figure 7:
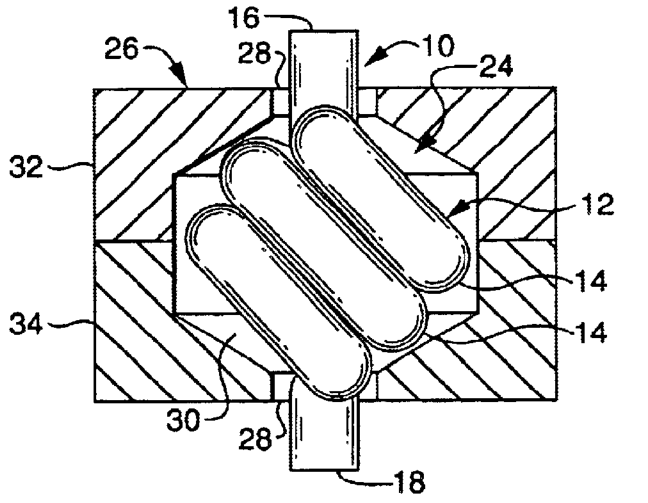
FIG. 7 is a partial cross-sectional side view of one embodiment of an assembly employing the skewed coil contact.
Figure 8:
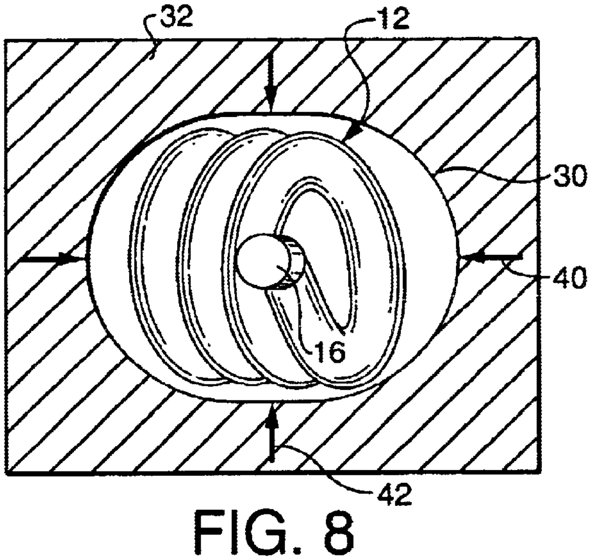
FIG. 8 is a partial cross-sectional top view of the assembly of FIG. 7.

In one application, shown in FIG. 7, the skewed coil contact 10 is placed within a through aperture 24 in a dielectric panel 26. The aperture 24 has openings 28 at both ends of a larger center section 30. The cross-sectional dimension of the center section 30 is slightly larger than the largest dimension of the contact perpendicular to the leads. In one configuration, shown in FIG. 8, the center section 30 has an oval cross section, where the direction 40 in which the coil 12 expands has the larger dimension. The smaller dimension 42 can be the same as the coil dimension, since the coil 12 does not expand in that dimension 42.

In one embodiment, shown in FIG. 7, the dielectric panel 26 has a base sheet 34 that contains one of the openings 28 and the entire center section 30 and a top sheet 32 that contains only the other opening 28. The contact 10 is placed in the base sheet part of the aperture 24 and the sheets 32, 34 are sandwiched together, capturing the contact 10 within the aperture 24.

Figure 9:
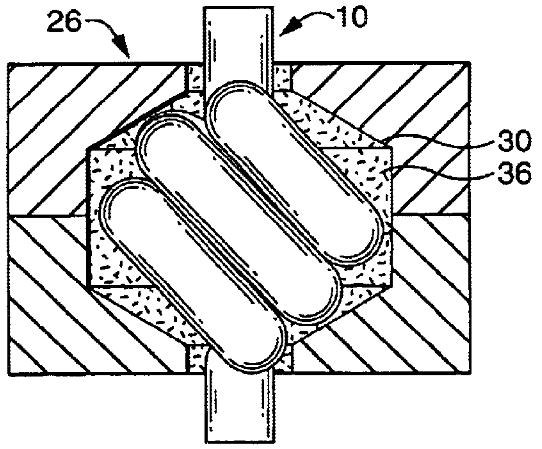
FIG. 9 is a partial cross-sectional side view of another embodiment of an assembly employing the skewed coil contact and filled with a conductive elastomer.

In another embodiment, shown in FIG. 9, the dielectric panel 26 has two mirror image sheets 46, 48, where each sheet has one opening 28 and a half of the center section 30. The contact 10 is placed in one side of the aperture 24 and the sheets 46, 48 are sandwiched together, capturing the contact 10 within the aperture 24.

When an axial compression force is applied to the leads 16, 18 protruding through the openings 28 of the dielectric panel 26, the loops 14 of the coil 12 expand. The aperture 24 maintains the position of the contact 10 as it is compressed. The aperture 24 may also maintain the integrity of the contact 10 by preventing the coil loops 14 from separating under the axial compression.

In another application, the skewed coil contact 10 is installed in the aperture 24 and the remaining space of the aperture 24 is filled with a compliant, electrically conductive elastomer 36, as shown in FIG. 9. The elastomer 36 performs a dual function. It adds to the resiliency of the contact 10, meaning that the contact 10 can tolerate more operational cycles than without the elastomer 34. The elastomer 34 also aids in electrically shorting the coil loops 14, thus potentially minimizing the electrical parasitic values of the contact system.

The skewed coil contact 10 can be made extremely small by employing extremely small wire and forming apertures 24 in the dielectric panel 26 for testing UUT's with pitches smaller that 0.5 mm (0.020"). The contacts 10 are adaptable to silicon wafer probing with pitches in the micrometers.

Figure 10:
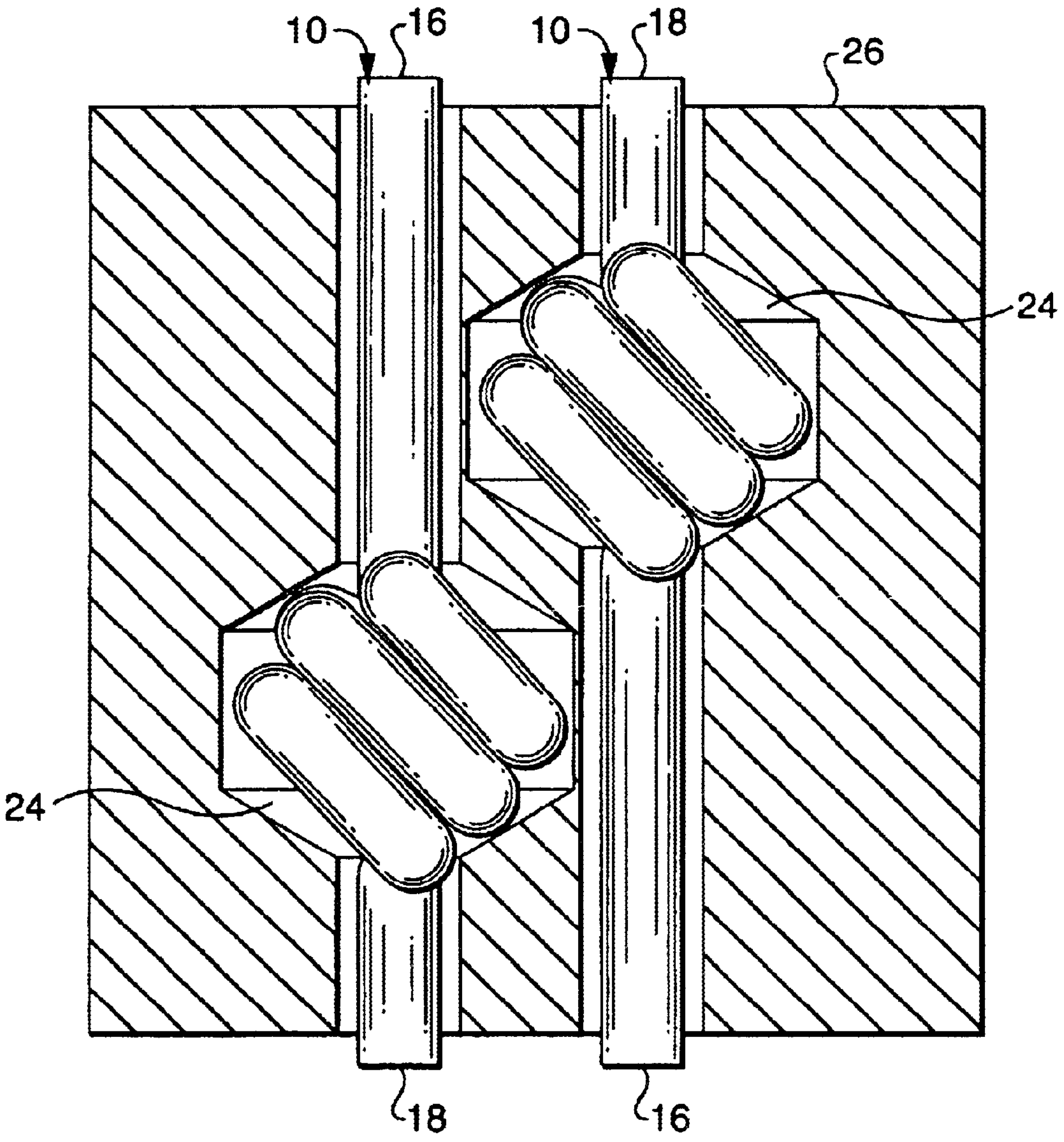
FIG. 10 is a partial cross-sectional side view of a pair of skewed coil contacts mounted in a dielectric sheet in very close proximity.

An alternate arrangement of the contacts 10 within a dielectric panel 26 is shown in FIG. 10. Note that one lead 16 is longer than the other 18 and that the apertures 24 are elongated and staggered. With this arrangement, the contacts 10 can be placed closer together. Particular applications of this arrangement include 4-wire testing where each IC lead requires two contacts, one for a drive current and the other for high-impedance sensing.

The skewed coil contact can be made of an optical fiber so that it may be used to make a temporary connection to UUT's with fiber optic interfaces. The skewed coil leads protrude axially from the coil, thus directing the light signals straight in and out of the contact. The purpose, obviously, is not to minimize parasitic electrical effects, since optical signals do not have such problems. The optical contact permits a mixture of electrical and optical signals on the same test fixture while providing the same compliance as the electrical skewed coil contact.

2. The Raveled Wire Embodiment of FIGS. 11 and 12

Figure 11:
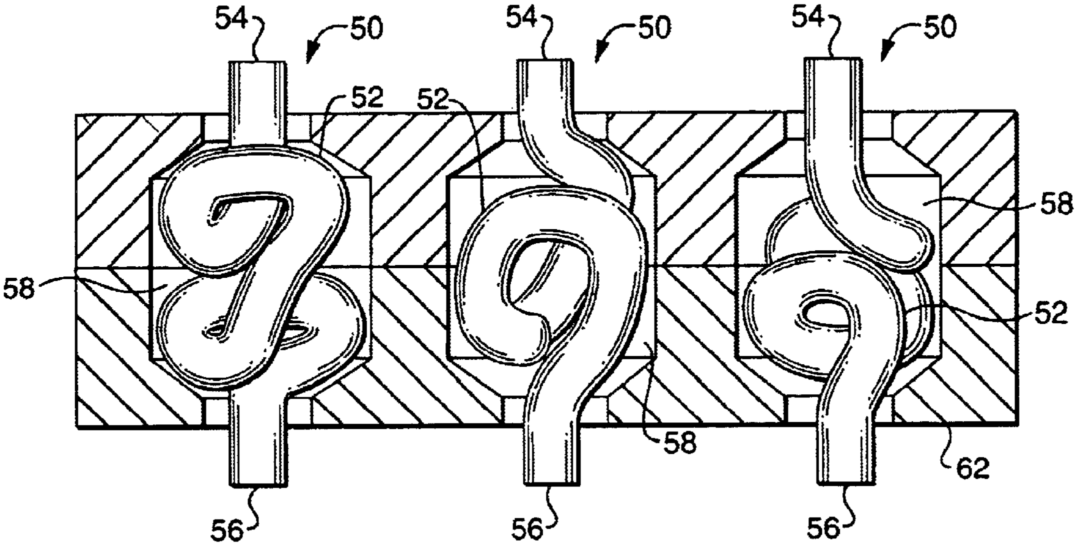
FIG. 11 is a partial cross-sectional view of several configurations of the raveled wire contact mounted in a dielectric sheet.
Figure 12:
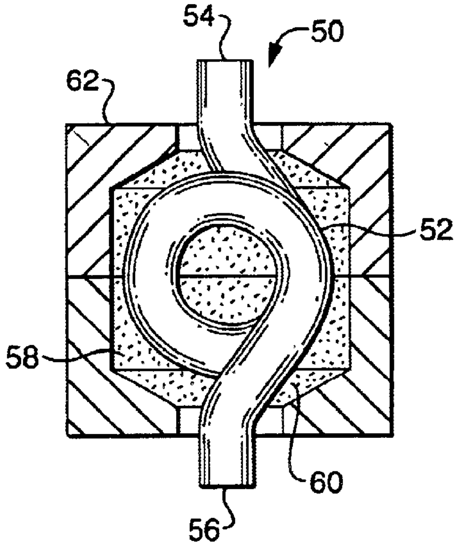
FIG. 12 is a partial cross-sectional side view of a configuration of the raveled wire contact mounted in a dielectric sheet and filled with a conductive elastomer.

The raveled wire embodiment, shown in FIGS. 11 and 12, consists of a length of wire that is forced into a cylindrical cavity that has a diameter larger than the cross-sectional dimension of the wire, typically two to four times larger. The result, shown variously in FIGS. 11 and 12, is a contact 50 that is comprised of randomly entangled convolutions 52 formed within the confines of a cylindrical shape with both extremities of the wire protruding paraxially as leads 54, 56 from either end of the convolutions 52. The leads 54, 56 protruding from the convolutions 52 provide a compliant contact point. The axially protruding leads 54, 56 are the key differentiators from the fuzz button contact of the prior art in that no additional contact elements are required in the contact system. Consequently, the contact has less inductance and can be made smaller than the fuzz button contact system.

The wire can be made of the same materials as the skewed coil contact 10. A contact 50 using a rectangular cross-section wire can induce consistent convolutions 52. When the wire is forced into a cavity at the time of manufacture, the wire tends to bend along its weakest point. With the rectangular cross-section, the weakest point is the shortest line through the wire axis, which is essentially the same throughout the length of the wire. Thus, a unidirectional collapse pattern is induced, causing the contact to compress consistently from contact to contact.

The leads 54, 56 can be formed into shapes in the same manner as the leads 16, 18 of the skewed coil contact 10. The raveled wire contact 50 can be made very small, like the skewed coil contact 10. As with the skewed coil contact 10, the raveled wire contact can be installed in a through aperture 58 in a dielectric panel 62. Also, as with the skewed coil contact 10, the remaining space of the aperture 58 can be filled with a compliant, conductive elastomer 60, as shown FIG. 12.

The cavity in which the contact 50 is formed can be round, square, or any other desired cross sectional shape. If the contact 50 is formed inside a rectangular, rather than circular, cavity, the apexes of the formed contact 50 may be used to hold the contact within the aperture 58.

Thus it has been shown and described a compliant electrical contact which satisfies the objects set forth above.

Since certain changes may be made in the present disclosure without departing from the scope of the present invention, it is intended that all matter described in the foregoing specification and shown in the accompanying drawings be interpreted as illustrative and not in a limiting sense.

I claim:

1. A compliant electrical contact assembly comprising:

(a) at least one compliant electrical contact, said contact including a length of wire having extremities and being composed of an electrically conductive, inherently elastic material, said wire being formed into a coil having at least slightly more than one loop and an axis, said extremities extending from said coil as leads in approximately opposite directions, and said coil axis being angled from said leads; and (b) a dielectric panel having a through aperture for each of said at least one electrical contact, said through aperture having a center section in which said coil is captured and opposed openings through which said leads extend, said center section being sized to permit said coil to compress and expand as axially pressure is applied to and removed from said leads.

2. The compliant electrical contact assembly of claim 1 wherein said aperture is filled with a compliant, conductive elastomer after said contact is installed in said aperture.

3. The compliant electrical contact assembly of claim 1 wherein said wire has a round cross-section.

4. The compliant electrical contact assembly of claim 1 wherein said wire has a cross-section with at least one flat side.

5. The compliant electrical contact assembly of claim 1 wherein at least one of said leads is configured with a shaped end.

6. The compliant electrical contact assembly of claim 1 wherein one of said leads is longer than the other of said leads.

7. The compliant electrical contact assembly of claim 1 wherein said wire is metallic.

8. The compliant electrical contact assembly of claim 1 wherein said wire has a cross-sectional dimension and the gap between said loops is no more than 100% of said cross-sectional dimension.

9. A compliant electrical contact comprising:

(a) a length of wire having extremities and being composed of an electrically conductive, inherently elastic material;

(b) said wire being formed into a coil having at least slightly more than one loop and an axis;

(c) each of said extremities forming a lead separated from said coil by a bend in said wire, said leads extending in approximately opposite directions; and (d) said coil axis being angled from said leads.

10. The compliant electrical contact of claim 9 wherein said wire has a round cross-section.

11. The compliant electrical contact of claim 9 wherein said wire has a cross-section with at least one flat side.

12. The compliant electrical contact of claim 9 wherein at least one of said leads is configured with a shaped end.

13. The compliant electrical contact of claim 9 wherein one of said lead is longer than the other of said leads.

14. The compliant electrical contact of claim 9 wherein said wire is metallic.

15. The compliant electrical contact of claim 9 wherein said wire has a cross-sectional dimension and the gap between said loops is no more than 100% of said cross-sectional dimension.

* * * * *